United States Patent
Ravetz et al.

(10) Patent No.: US 6,698,728 B1
(45) Date of Patent: Mar. 2, 2004

(54) METHOD AND APPARATUS FOR DELIVERING PRECURSORS TO A PLURALITY OF EPITAXIAL REACTOR SITES

(75) Inventors: Megan Ravetz, Newton (GB); Graham Williams, Hoowall (GB); Andrew Nelson, Cowridge (GB); Roy Trevor Blunt, Cwmbran (GB); Howard Williams, St. Mellons (GB); Rajesh Odedra, Altrincham (GB)

(73) Assignees: Epichem Limited (GB); IQE PLC (GB)

( * ) Notice: Subject to any disclaimer, the term of this patent is extended or adjusted under 35 U.S.C. 154(b) by 42 days.

(21) Appl. No.: 10/149,092

(22) PCT Filed: Jul. 3, 2000

(86) PCT No.: PCT/GB00/02559

§ 371 (c)(1),
(2), (4) Date: Jun. 6, 2002

(87) PCT Pub. No.: WO01/42539

PCT Pub. Date: Jun. 14, 2001

(30) Foreign Application Priority Data

Dec. 11, 1999 (GB) .............................. 9929279

(51) Int. Cl.⁷ .............................................. B01D 47/02
(52) U.S. Cl. ................................................ 261/121.1
(58) Field of Search .............................. 261/121.1, 126

(56) References Cited

U.S. PATENT DOCUMENTS

| | | | | |
|---|---|---|---|---|
| 4,276,243 A | * | 6/1981 | Partus | 261/128 |
| 4,582,480 A | * | 4/1986 | Lynch et al. | 432/1 |
| 5,589,110 A | * | 12/1996 | Motoda et al. | 261/61 |
| 5,972,117 A | * | 10/1999 | Schmitt | 118/726 |
| 6,123,765 A | * | 9/2000 | Sinha et al. | 117/84 |
| 6,155,540 A | * | 12/2000 | Takamatsu et al. | 261/78.2 |
| 6,443,435 B1 | * | 9/2002 | Hendrickson | 261/128 |

FOREIGN PATENT DOCUMENTS

| | | | |
|---|---|---|---|
| EP | 420596 | * 3/1991 | |
| EP | 0696472 | 2/1996 | B01J/4/00 |
| EP | 0931861 | 6/1998 | C30B/25/14 |
| JP | 60131973 | 7/1985 | C23C/16/50 |
| JP | 3031477 | 2/1991 | C23C/16/44 |
| WO | 9827247 | 12/1997 | C23C/16/00 |
| WO | 0002559 | 7/2000 | C30B/25/14 |
| WO | 0142539 | 7/2000 | C30B/25/14 |

* cited by examiner

Primary Examiner—Joseph A. Dillon

(57) ABSTRACT

A method and apparatus for the bulk delivery of a precursor, such as an organometallic compound, from a bulk container, such as a bubbler (1) to a plurality of reactor sites (12, 14, 16, 18, 20) wherein a carrier gas (2) is introduced into the container (1) of the precursor to pick up the precursor to form a gaseous mixture. The gaseous mixture is then selectively distributed to one or more of a plurality of reactor sites (12, 14, 16, 18, 20). The gaseous mixture may be stored in a reservoir (9) and be drawn by means of a pressure differential or under vacuum to each of the reactor sites, when required.

21 Claims, 2 Drawing Sheets

Figure 1:
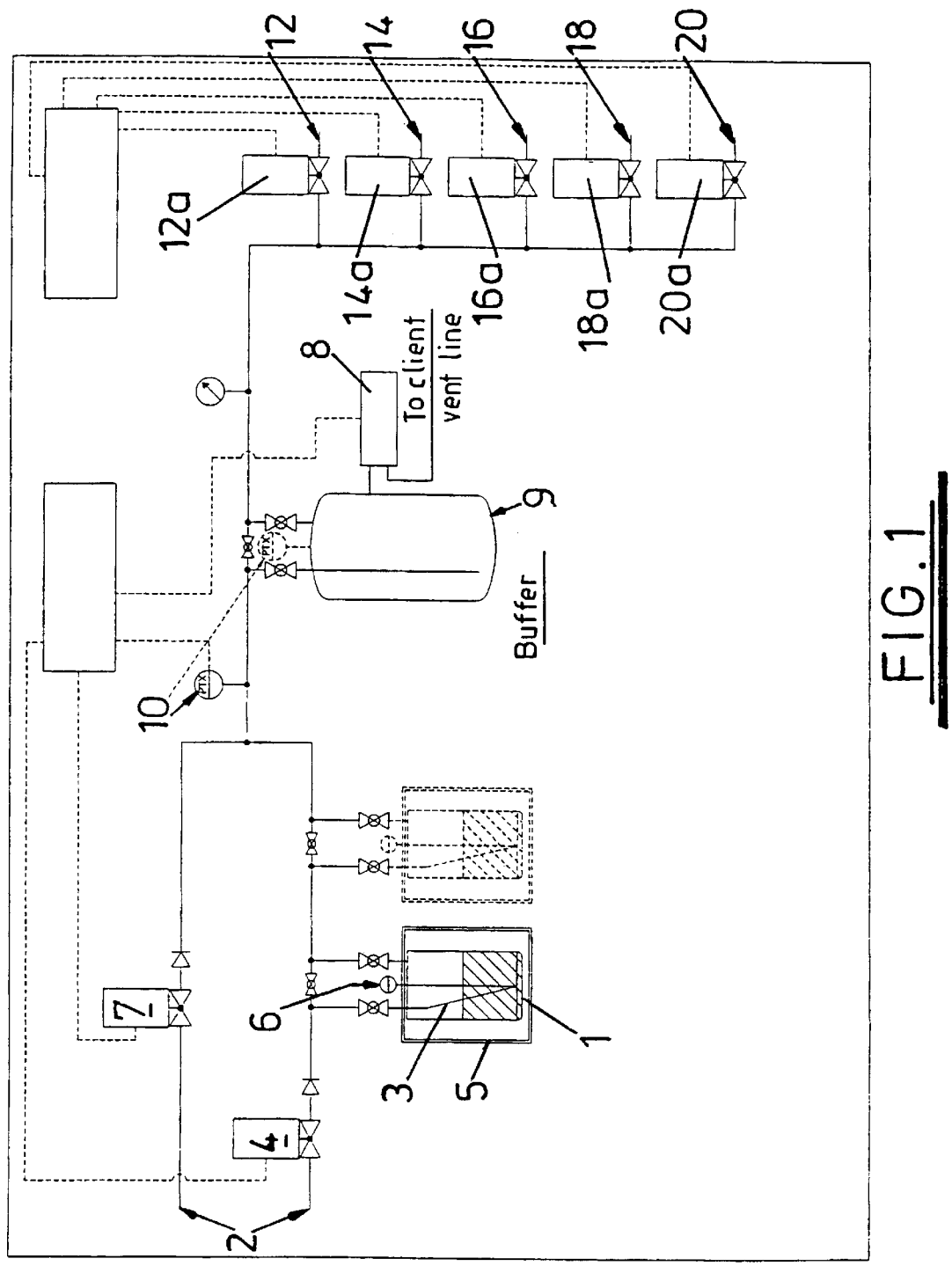

METHOD AND APPARATUS FOR DELIVERING PRECURSORS TO A PLURALITY OF EPITAXIAL REACTOR SITES

DESCRIPTION

The present invention relates to an improved method of, and apparatus for the delivery of precursors in the vapour phase to a plurality of expitaxial reactor sites, particularly in relation to the delivery of organometallic compounds.

It is common practice in the semiconductor industry for electronic devices to be produced by means of a Chemical Vapour Deposition (CVD) process. Precursors (liquid or solid) are supplied in bubblers wherein, in use, a carrier gas is bubbled through and becomes saturated with the precursor via a dip pipe. The carrier gas/vapour mixture is then passed at a controlled rate into an epitaxial reactor. Such systems are used in the production of both silicon and compound semiconductors, with early versions being specific to individual reactors.

With growth in demand for semiconductors, initially in the silicon area, it was necessary to introduce bulk distribution systems wherein a central reservoir fed a number of bubblers, local to each reactor. These systems, typically used for the delivery of Tetraethoxysilane (TEOS), have been actively marketed by the suppliers of TEOS but have only been applied to the distribution of liquids.

However, a number of precursors for semiconductor production are transported from the bubbler to their reactor in the gaseous phase and up until now such transportation has been achieved on an individual basis. This has obvious drawbacks, such as the downtime required for the changeout of the bubblers at the individual reactors and the cost in relation to the increased quantity and complexity of the local pick up and control equipment required for each chemical at each reactor.

The production of the equipment for transportation of the precursor from the bubbler to the reaction site has to be specially designed to make it suitable for carrying the many potentially hazardous chemicals that are used in semiconductor production, such as Trimethylgallium, Trimethylindium, Trimethylaluminium, Dimethylzinc and Triethylgallium. One of the potential hazards of all these chemicals is their pyrophoricity (i.e. they ignite spontaneously on contact with air).

It is an object of the present invention to provide an improved method of, and apparatus for, delivery of precursors to a reactor site, particularly in relation to organometallic compounds, that aims to overcome the abovementioned drawbacks.

Accordingly, a first aspect of the present invention provides a method for delivering an organometallic compound to a plurality of reactor sites, the method comprising the steps of introducing a carrier gas into a container of the organometallic compound, picking up the compound in the gas to form a gaseous mixture, transporting the gaseous mixture to a reservoir and selectively distributing the gaseous mixture to one or more of a plurality of reactor sites, the method excluding the step of condensing the gaseous mixture.

A second aspect of the present invention provides an apparatus for delivering an organometallic compound to a plurality of reactor sites, the apparatus comprising an inlet for introducing a carrier gas into a container of the organometallic compound, a reservoir for storage of the gaseous mixture of the compound and the carrier gas and an outlet for selectively distributing the gaseous mixture to one or more of a plurality of reactor sites, the apparatus excluding a condensor for condensation of the gaseous mixture.

Preferably, the rate of flow of the carrier gas and the carrier gas/precursor mixture through the apparatus is controlled by means of a system of mass flow controllers. A first mass flow controller is preferably positioned to control the rate of flow of the carrier gas into the container.

Preferably, a second source of carrier gas is introduced into the gaseous mixture after pick up of the precursor or. The addition of a second source of carrier gas is preferably monitored by a second mass flow controller after pick up of precursor to maintain the vapour concentration below saturation to ensure that the precursor remains in the vapour phase. Additionally or alternatively, the system maybe heated. This assists in maintaining the vapour concentration below saturation to ensure that the precursor remains in the vapour phase. Preferably, the second mass flow controller is linked to the first mass flow controller such that the two flows of carrier gas are always in the same ratio to each other.

The gaseous mixture is preferably transported to a reservoir for storage thereof, the reservoir having means for selectively distributing the mixture to a plurality of reactor sites. The reservoir is preferably provided with a pressure controller that is connected to the first mass flow controller to determine the rate of flow of carrier gas into the container. The pressure in the storage reservoir is controlled such as to enable a uniform supply of the gaseous mixture to the different reactors. The storage of bulk material in the gaseous phase has not previously been utilized in relation to the delivery of precursors to a reactor site. Prior hereto, storage has always been in the liquid or solid phase.

The gaseous mixture is preferably drawn under vacuum or by means of a pressure differential from the reservoir to each of the reactor sites. Preferably, each reactor is provided with its own mass flow controller to determine the rate of entry of the gaseous mixture into the reactor.

It is preferable for constant pick up of the precursor in the carrier gas to be achieved by the method and apparatus of the present invention. More preferably still, constant pick up is achieved over a wide range of flow rates, such as 0 to 10 litres per minute.

The container of precursor is preferably in the form of a bubbler, the carrier gas being introduced into the bubbler by means of a dip pipe. Preferably, the bubbler is surrounded by a temperature controlled oil bath. It is preferable to provide a means of monitoring the level of precursor in the bubbler (this may be achieved, for example, by a level alarm, a weighscale or a gas concentration monitor/totaliser).

A third aspect of the present invention provides a bubbler comprising a container for precursor and a dip pipe for passage of a carrier gas therethrough to pick up the precursor in the gas, wherein the bubbler includes one or more of the following features:

(a) a narrowing of the container at or near the base thereof to aid complete utilisation of the precursor therein; and (b) one or more hollow members extending substantially perpendicularly to the dip pipe and being in fluid communication therewith, each member having an opening therein to aid pick up of the precursor.

The base of the bubbler may be provided with a narrowing or may have a smaller vessel placed therein relative to the bubbler, for example being in the form of a well at the bottom of the bubbler. The end of the dip pipe is placed within the narrowing or smaller vessel to ensure that constant pick up of the precursor is achieved until almost complete utilisation of the precursor contained within the bubbler.

The dip pipe is preferably designed to provide an increased rate of pick up of the precursor. Preferably, the dip pipe is provided with one or more hollow members extending substantially perpendicularly from the main body of the dip pipe, preferably situated at the base thereof. The members are preferably provided with a plurality of holes in one or more sides thereof. More preferably, the dip pipe is provided with a hollow cross at the base thereof. Preferably, each leg of the cross has a plurality of holes. More preferably, the holes are provided in the same side of each leg. This design ensures a small bubble size together with a swirling motion to give highly efficient pick up.

The carrier gas that picks up the precursor may be any suitable permanent gas, such as hydrogen. The apparatus and method of the present invention are particularly suitable for delivering organometallic compounds to epitaxial reactors, such as Trimethylgallium, Trimethylindium, Trimethylaluminium, Dimethylzinc and Triethylgallium.

Figure 2:
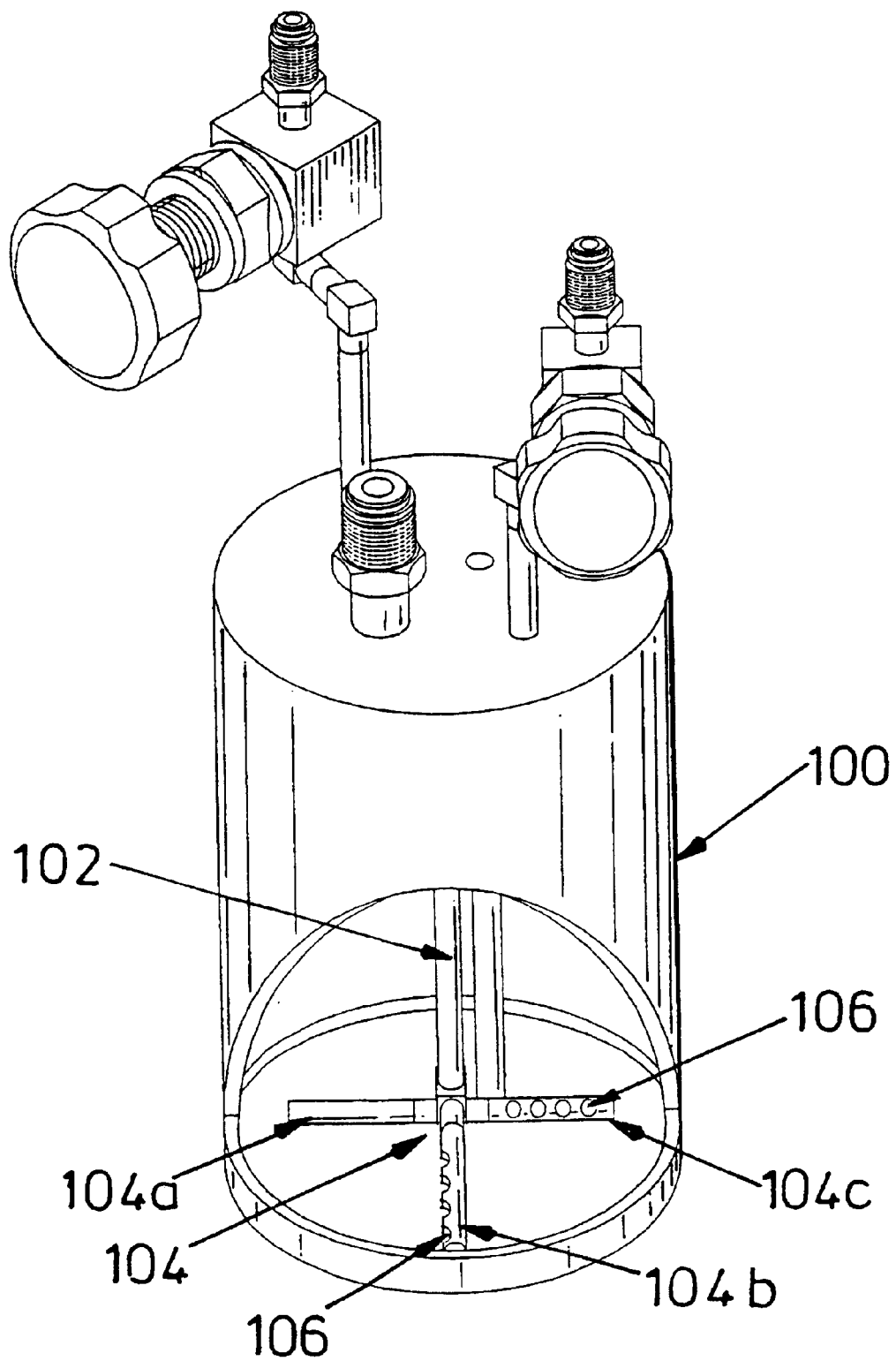

For a better understanding of the present invention and to show more clearly how it may be carried into effect, reference will now be made by way of example only to the accompanying drawings in which:

FIG. 1 is a schematic diagram of the components of an apparatus according to one embodiment of the present invention; and FIG. 2 is an isometric diagram of a bubbler for an apparatus according to the present invention, having a front part removed to show the dip pipe of the bubbler.

Referring to FIG. 1 of the accompanying drawings, a bulk distribution apparatus for delivering a precursor in the vapour phase from a bulk container 1 to a plurality of reactor vessels 12, 14, 16, 18, 20 according to one embodiment of the present invention is illustrated. A flow 2 of carrier gas, typically hydrogen (but possibly any permanent gas) is passed at a rate set by a mass flow controller 4 into a bulk bubbler 1, via a dip pipe 3, containing the precursor to be delivered to the plurality of epitaxial reactors. The bulk bubbler 1 is held in a temperature controlled oil bath 5 and is fitted with a level alarm 6 to provide an indication of the fill state. The bulk bubbler's internal design (see FIG. 2) is such as to ensure constant pick up over a wide range of flow rates (0 to 10 litres/min) and to achieve almost complete utilisation of the contained chemical (down to the last 2%).

The hydrogen 2 picks up the precursor from the bubbler 1 and the resulting gas stream is diluted by a further injection of hydrogen, this flow being set by a mass flow controller 7, positioned in ratio to the mass flow controller 4. This secondary dilution is mainly required to reduce vapour concentration to below saturation thereby ensuring that the precursor remains in the vapour phase as it passes through the system. Alternatively, this may be achieved by heating the system downstream of the bubbler, or by a combination of these two measures.

The gas mixture is then passed into a central reservoir 9, fitted with a pressure controller 10, the output from which is used to position the principal hydrogen mass flow controller 4. Concentration of the gaseous mixture in the reservoir is measured using a concentration monitor 8. Vapour may be drawn from the central reservoir, by pressure differential, to any number of epitaxial reactors 12, 14, 16, 18, 20 at flow rates set by individual mass flow controllers 12a, 14a, 16a, 18a, 20a for each reactor.

It is to be appreciated that the method and apparatus of the present invention may be used to deliver any precursor in the vapour phase to a plurality of reactor sites but the invention is particularly suitable for the bulk distribution of organometallic compounds, such as those used in the production of semiconductors. For example, such compounds include Trimethylgallium, Trimethylindium, Trimethylaluminium, Dimethylzinc and Triethylgallium.

It is important that the method and apparatus of the present invention are able to provide a vapour of constant composition over a wide range of flow rates and that constant pick-up can be achieved when only 2% of residual precursor remains in the container. Additionally, it is preferable that the composition of the precursor/carrier gas mixture being delivered to a plurality of reactor sites can be monitored by a single gas concentration monitor.

The apparatus of the present invention enables a precursor chemical to be transported in the vapour phase from a central reservoir to a plurality of reactor sites. One of the main advantages provided by this system is the reduced downtime associated with the changeout of the bubblers for the individual reactors. A further advantage is the reduction in the quantity, complexity and cost of the local pick-up and control equipment required for each chemical at each reactor. Furthermore, the ability to deliver the pyrophoric precursors as a vapour increases the safety of the system due to the vapour containing only a low concentration of the precursor (less than 5%) in contrast to the high concentration (100%) required for bulk liquid distribution.

An important feature of the present apparatus is the internal design of the bulk bubbler 1. Normally, it would be very difficult to achieve constant pick-up and flow rates from the bubbler when there is only a small amount of residual precursor remaining in the bubbler container. The present invention overcomes this problem to provide a constant pick up (for carrier gas flowrates up to 10 litres/min) by providing a well or narrowing within the bulk vessel bubbler. For example, a 20 liter volume bubbler may be provided with a 1 liter volume well, into which the dip pipe projects.

Additionally, the bubbler for use in the present invention may be provided with a novel construction of dip pipe which aids pick up of the precursor. For example, FIG. 2 of the accompanying drawings illustrates a bubbler 100 fitted with a dip pipe that has the main hollow body 102 extending substantially vertically down through the centre of the bubbler and is provided with a hollow cross 104, each leg 104a, 104b, 104c of which extends substantially perpendicularly from the main body and has four holes 106 all drilled on the same side of each leg. Such a design ensures a small bubble size together with a swirling motion to give highly efficient pick up. This design of bubbler enables a far greater rate of pick up (around 10 litres/min) than can be obtained from a small volume bubbler.

What is claimed is:

1. A method for delivering an organometallic compound to a plurality of reactor sites, the method comprising the step of introducing a carrier gas into a container of the organometallic compound, picking up the compound in the gas to form a gaseous mixture, transporting the gaseous mixture to a reservoir and selectively distributing the gaseous mixture to one or more of a plurality of reactor sites, the method excluding the step of condensing the gaseous mixture.

2. A method as claimed in claim 1, wherein the rate of flow of the carrier gas and the carrier gas/organometallic mixture is controllable.

3. A method as claimed in claim 1, further comprising introducing a second source of carrier gas into the gaseous mixture after pick up of the organometallic compound.

4. A method as claimed in claim 3, wherein the addition of the second source of carrier gas is monitored top maintain the vapour concentration below saturation.

5. A method as claimed in claim 1, further comprising the step of heating the gaseous mixture.

6. A method as claimed in claim 1, wherein the gaseous mixture is drawn under vacuum or by means of pressure differential from the reservoir to each of the reactor sites.

7. A method as claimed in claim 1, wherein the pick up of organometallic compound in the carrier gas is kept constant.

8. A method of claimed in claim 7, wherein a constant pick up is achieved over flow rates ranging from 0 to 10 liters per minute.

9. A method as claimed in claim 1, wherein the carrier gas is hydrogen.

10. An apparatus adapted for delivering an organometallic compound to a plurality of reactor sites, the apparatus comprising an inlet adapted for introducing a carrier gas into a container of the organometallic compound, a reservoir for storage of the gaseous mixture of the compound and the carrier gas and an outlet for selectively distributing the gaseous mixture to one or more of a plurality of reactor sites, the apparatus excluding a condensor for condensation of the gaseous mixture.

11. An apparatus as claimed in claim 10, wherein one or more mass flow controllers are provided to control the rate of flow of the carrier gas and the carrier gaseous mixture through the apparatus.

12. An apparatus as claimed in claim 11, wherein a first mass controller is positioned to control the rate of flow of carrier gas into the container.

13. An apparatus as claimed in claim 10, further comprising means for introduction of a second source of carrier gas into the gaseous mixture after pick up of the organometallic compound.

14. An apparatus as claimed in claim 13, wherein a second mass flow controller is provided to monitor the addition of the second source of carrier gas.

15. An apparatus as claimed in claim 13, wherein the second mass flow controller is linked to the first mass flow controller.

16. An apparatus as claimed in claim 10, wherein the reservoir is provided with a pressure controller.

17. An apparatus as claimed in claim 10, wherein means is provided to allow the gaseous mixture to be drawn under vacuum or by means of a pressure differential from the reservoir to each of the reactor sites.

18. An apparatus as claimed in claim 10, wherein each reactor site is provided with its own mass flow controller to determine the rate of entry of the gaseous mixture into the reactor.

19. An apparatus as claimed in claim 10, wherein the container of organometallic compound is a bubbler, the carrier gas being introduced into the bubbler by means of a dip pipe.

20. An apparatus as claimed in claim 19, wherein the bubbler is surrounded by a temperature controlled oil bath.

21. An apparatus as claimed in claim 19, wherein the bubbler is provided with means for monitoring the level or organometallic compound therein.

* * * * *